(12) United States Patent  (10) Patent No.: US 8,119,966 B2
Sugiyama et al.  (45) Date of Patent: Feb. 21, 2012

(54) SOLID-STATE IMAGE PICKUP DEVICE SUPPRESSING POWER CONSUMPTION IN CASE OF INCREASE IN IMAGING PIXELS OR SPEED BY CONTROLLING IMAGING A/D CONVERTING CIRCUIT BY SIGNAL FROM LOW POWER TRIGGERING A/D CONVERTING CIRCUIT

(75) Inventors: Yukinobu Sugiyama, Hamamatsu (JP); Seiichiro Mizuno, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 366 days.

(21) Appl. No.: 12/298,264

(22) PCT Filed: Apr. 23, 2007

(86) PCT No.: PCT/JP2007/058738
§ 371 (c)(1),
(2), (4) Date: Feb. 5, 2009

(87) PCT Pub. No.: WO2007/125865
PCT Pub. Date: Nov. 8, 2007

(65) Prior Publication Data
US 2009/0321615 A1    Dec. 31, 2009

(30) Foreign Application Priority Data

Apr. 24, 2006   (JP) ................................ 2006-119497

(51) Int. Cl.
*H01L 27/00*  (2006.01)
*H01L 27/146*  (2006.01)
*H05G 1/64*  (2006.01)

(52) U.S. Cl. ................ 250/208.1; 250/370.09; 378/98.8

(58) Field of Classification Search ............... 250/208.1, 250/370.09; 378/98.8
See application file for complete search history.

(56) References Cited

U.S. PATENT DOCUMENTS
5,444,756 A * 8/1995 Pai et al. ...................... 378/98.8
(Continued)

FOREIGN PATENT DOCUMENTS
EP  1 227 662 A2  7/2002
(Continued)

OTHER PUBLICATIONS

E. R. Fossum et al., "A 37×28mm² 600k-Pixel CMOS APS Dental X-Ray Camera-on-a-Chip with Self-Triggered Readout," Solid-State Circuits Conference, 1998, Digest of Technical Papers, 1998 IEEE International San Francisco, CA, Feb. 5-7, 1998, New York, NY, IEEE, Feb. 5, 1998, pp. 172-173, XP010278577.

(Continued)

*Primary Examiner* — Thanh X Luu
(74) *Attorney, Agent, or Firm* — Drinker Biddle & Reath LLP

(57) ABSTRACT

The solid-state image pickup device 1 includes an imaging region 10, a triggering photosensitive region 20, a row selecting section 30, a column selecting section 40, a voltage holding section 50, an output section 60, and a controlling section 70. The solid-state image pickup device 1 reads out triggering data by the triggering photosensitive region 20, the integrating circuit 62, and the triggering A/D converting circuit 64 before light incidence, and senses the light incidence on the basis of the triggering data. After the solid-state image pickup device senses the light incidence, the solid-state image pickup device reads out pixel data by the imaging region 10, the voltage holding section 50, a differential operating circuit 61, and an imaging A/D converting circuit 63.

7 Claims, 10 Drawing Sheets

U.S. PATENT DOCUMENTS 7,116,459 B2 * 10/2006 Huffman ............... 359/239
2003/0123123 A1 7/2003 Huffman

FOREIGN PATENT DOCUMENTS

| JP | 5-130990 | 5/1993 |
|---|---|---|
| JP | 6-507796 | 9/1994 |
| JP | 07-230893 A | 8/1995 |
| JP | 09-131337 A | 5/1997 |
| JP | 11-188033 | 7/1999 |
| JP | 2001-299734 | 10/2001 |
| JP | 2002-505002 | 2/2002 |
| JP | 2003-126072 | 5/2003 |
| JP | 2005-159418 | 6/2005 |

OTHER PUBLICATIONS

Fossum, "CMOS Image Sensors: Electronic Camera-On-A-Chip," IEEE Transactions on Electron Devices, IEEE Service Center, Piscataway, NJ, vol. 44, No. 10, Oct. 1, 1997, pp. 1689-1698, XP011016264.

* cited by examiner

SOLID-STATE IMAGE PICKUP DEVICE SUPPRESSING POWER CONSUMPTION IN CASE OF INCREASE IN IMAGING PIXELS OR SPEED BY CONTROLLING IMAGING A/D CONVERTING CIRCUIT BY SIGNAL FROM LOW POWER TRIGGERING A/D CONVERTING CIRCUIT

TECHNICAL FIELD

The present invention relates to a solid-state image pickup device having an imaging region in which a plurality of pixels respectively including photodiodes that each generate electric charge of an amount according to an incident light amount are arranged two dimensionally.

BACKGROUND ART

A solid-state image pickup device includes an imaging region in which a plurality of pixels respectively including photodiodes are arranged two dimensionally. Further, in some cases, the solid-state image pickup device includes an A/D converting circuit that outputs a digital value according to an amount of electric charge generated in a photodiode of each pixel. In such a solid-state image pickup device, the number of pixels is ever-increasing, and further, the speeding-up of imaging has been demanded. Such an increase in the number of pixels and speeding-up of imaging generally bring about an increase in power consumption of the solid-state image pickup device.

Patent Document 1: Japanese Translation of International Application Kohyo) No. 2002-505002

DISCLOSURE OF THE INVENTION

Problem to be Solved by the Invention

Meanwhile, depending on the usage of a solid-state image pickup device, attempts have been made to suppress an increase in power consumption, or attempts have been made to preferably reduce power consumption in some cases. For example, there are cases in which attempts have been made to drive the solid-state image pickup device with a battery over a long period of time, attempts have been made to suppress heat generation due to the configuration of an apparatus including the solid-state image pickup device, and the like. The present invention has been made in order to solve the above problem, and an object thereof is to provide a solid-state image pickup device capable of suppressing an increase in power consumption even if the intention is to increase the number of pixels or speed up imaging.

Means for Solving the Problem

A solid-state image pickup device according to the present invention includes: (1) an imaging region which includes a plurality of pixels each having a photodiode that generates electric charge of an amount according to an incident light amount and a charge storing section storing the electric charge, the imaging region stores electric charge generated in the photodiode in each of the plurality of pixels by the charge storing section during a period instructed by a controlling signal of a charge storing operation; (2) a triggering photosensitive region which includes a triggering photodiode that generates electric charge of an amount according to an incident light, amount; and (3) an output section that outputs a digital value (hereinafter, referred to as "pixel data") according to the amount of electric charge stored in the charge storing section in each of the plurality of pixels after the period instructed by the controlling signal of the charge storing operation, and outputs a digital value hereinafter, referred to as "triggering data") according to the amount of electric charge generated in the triggering photosensitive region during a period when the pixel data is not output. Moreover, the output section included in the solid-state image pickup device operates with lower power consumption at the time of outputting the triggering data as compared with the time of outputting the pixel data. Further, the output section preferably operates at a lower speed or with a smaller number of output bits at the time of outputting the triggering data as compared with the time of outputting the pixel data.

In the solid-state image pickup device according to the present invention, each of the plurality of pixels included in the imaging region has a photodiode that generates electric charge of an amount according to an incident light amount and a charge storing section that stores the electric charge. The electric charge generated in the photodiode in each of the plurality of pixels are stored by the charge storing section during a period instructed by a controlling signal of a charge storing operation. On the other hand, electric charge of an amount according to an incident light amount is generated in the triggering photodiode included in the triggering photosensitive region. After the period instructed by the controlling signal of the charge storing operation, a digital value pixel data) according to the amount of electric charge stored in the charge storing section in each of the plurality of pixels is output from the output section. Further, during a period when the pixel data is not output from the output section, a digital value (triggering data) according to the amount of electric charge generated in the triggering photosensitive region is output from the output section.

In this way, the period when the pixel data is output and the period when the triggering data is output are distinguished from one another. Then, the output section operates with lower power consumption at the time of outputting the triggering data as compared with the time of outputting the pixel data. Further, the output section operates at a lower speed or with a smaller number of output bits, which enables the output section to operate with lower power consumption.

In the solid-state image pickup device according to the present invention, it is preferable that the output section includes an imaging A/D converting circuit that performs an A/D converting operation to output the pixel data after the period instructed by the controlling signal of the charge storing operation, and a triggering A/D converting circuit that outputs the triggering data, and the triggering A/D converting circuit operates with lower power consumption as compared with the imaging A/D converting circuit. In this case, during the period when the pixel data is output from the output section, the imaging A/D converting circuit operates, and the triggering A/D converting circuit is suspended. On the other hand, during the period when the triggering data is output from the output section, the triggering A/D converting circuit operates, and the imaging A/D converting circuit is suspended.

In the solid-state image pickup device according to the present invention, it is preferable that the output section outputs the pixel data and the triggering data to a common output signal line. In this case, because the pixel data and the triggering data are output from the output section to the common output signal line in a time-division-multiplexed manner, a small number of wirings for inputting and outputting signals and the like with an external device may be sufficient, and when the solid-state image pickup device possesses higher reliability in use in X-ray imaging in an oral cavity, for example. In addition, it is preferable that the pixel data and the triggering data output from the output section to the common output signal line are serial data.

It is preferable that the solid-state image pickup device according to the present invention further includes a controlling section to which the triggering data output from the output section is input, and generates the controlling signal of the charge storing operation, which is instructing each of the plurality of pixels in the imaging region to perform a charge storing operation when an absolute value of the triggering data is greater than a threshold value. In this case, the controlling signal of the charge storing operation is automatically generated by the controlling section on the basis of the triggering data output from the output section.

In the solid-state image pickup device according to the present invention, it is preferable that the triggering photosensitive region includes one triggering photodiode provided so as to surround the imaging region. Moreover, it is also preferable that the triggering photosensitive region includes a plurality of triggering photodiodes which are provided around the imaging region so as to be connected to one another. By thus forming the triggering photosensitive region, light incidence into the solid-state image pickup device can be detected with high sensitivity.

Effects of the Invention

The solid-state image pickup device according to the present invention is capable of suppressing an increase in power consumption even when an attempt is made to increase the number of pixels or speed up imaging.

DESCRIPTION OF SYMBOLS

Figure 1:
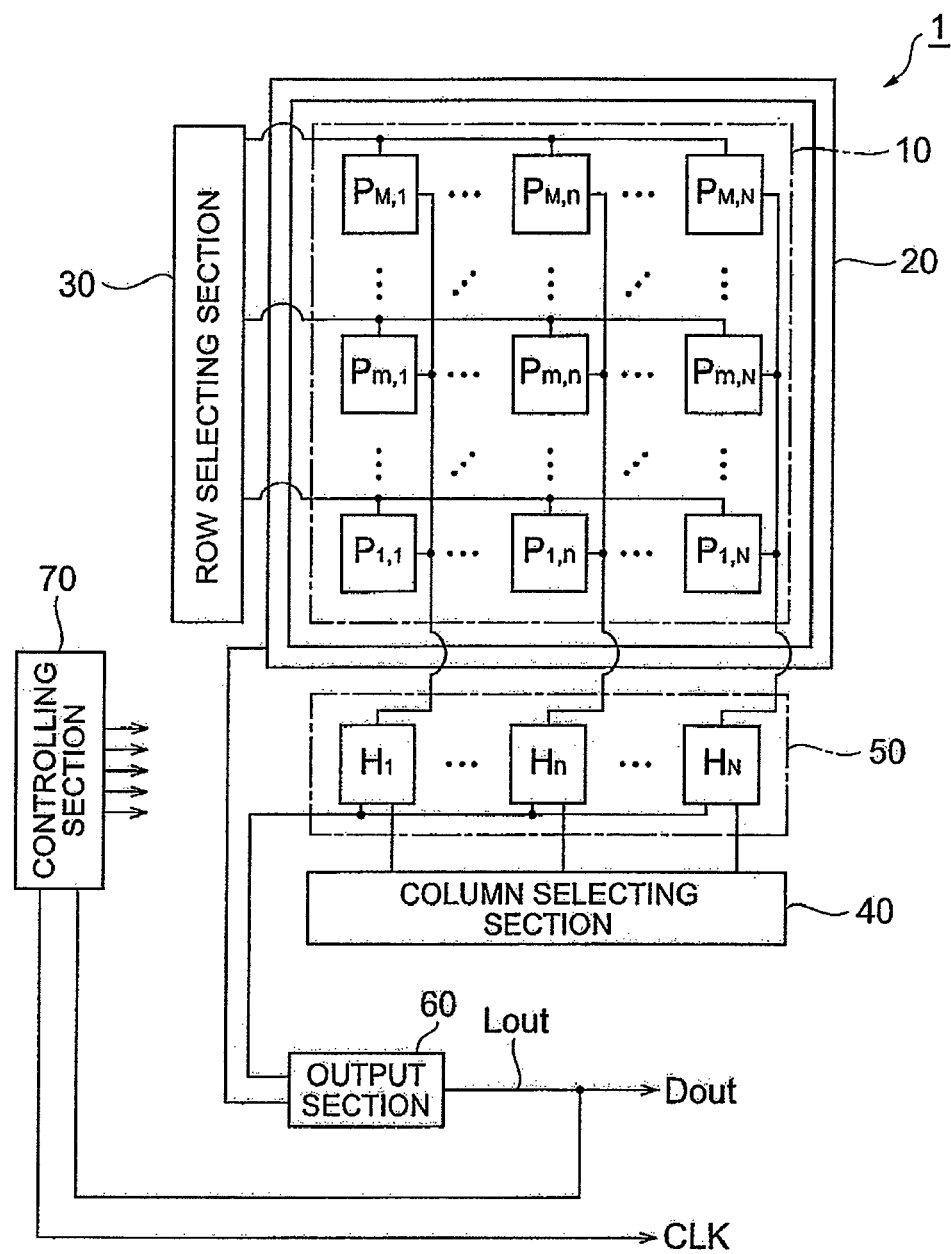
FIG. 1 is a configuration diagram of a solid-state image pickup device 1 according to the present embodiment.

1 Solid-state image pickup device
10 Imaging region
20 Triggering photosensitive region
30 Row selecting section
40 Column selecting section
50 Voltage holding section
60 Output section
61 Differential operating circuit
62 Integrating circuit
63 Imaging A/D converting circuit
64 Triggering A/D converting circuit
70 Controlling section
$P_{1,1}$-$P_{M,N}$ Pixels

BEST MODES FOR CARRYING OUT THE INVENTION

Hereinafter, a best mode for carrying out the present invention will be described in detail with reference to the accompanying drawings. Here, in the description of the drawings, identical elements are designated with identical numerical symbols so as to avoid overlapping descriptions.

FIG. 1 is a configuration diagram of a solid-state image pickup device 1 according to the present embodiment. The solid-state image pickup device 1 shown in this drawing includes an imaging region (an imaging photodetecting section) 10, a triggering photosensitive region (a triggering photodetecting section) 20, a row selecting section 30, a column selecting section 40, a voltage holding section 50, an output section 60, and a controlling section 70. In addition, in this drawing, wirings among elements are omitted or simplified.

The imaging region 10 is a region for taking an image of incident light, and includes pixels $P_{1,1}$, to $P_{M,N}$ arrayed two dimensionally in M rows and N columns. A pixel $P_{m,n}$ is located in the m-th row and the n-th column. The M×N pixels $P_{1,1}$ to $P_{M,N}$ have a common configuration, and each of those includes a photodiode that generates electric charge of an amount according to the incident light amount and a charge storing section that stores the electric charge. The imaging region 10 stores the electric charge generated in the photodiode in each of the M×N pixels $P_{1,1}$ to $P_{M,N}$ by the charge storing section during a period instructed by a controlling signal of the charge storing operation, which is output from the controlling section 70. Where M and N are integers greater than or equal to 2, m is an integer greater than or equal to 1 and less than or equal to M, and n is an integer greater than or equal to 1 and less than or equal to N.

The triggering photosensitive region 20 is a region for sensing light incidence, and includes a triggering photodiode that generates electric charge of an amount according to the incident light amount. The number and the arrangement of the triggering photodiodes included in the triggering photosensitive region 20 may be made in various modes. However, in order to sense light incidence with high sensitivity, it is preferable that the triggering photodiodes are provided so as to surround the imaging region 10, and also the photodetecting area is wide.

Figure 8:
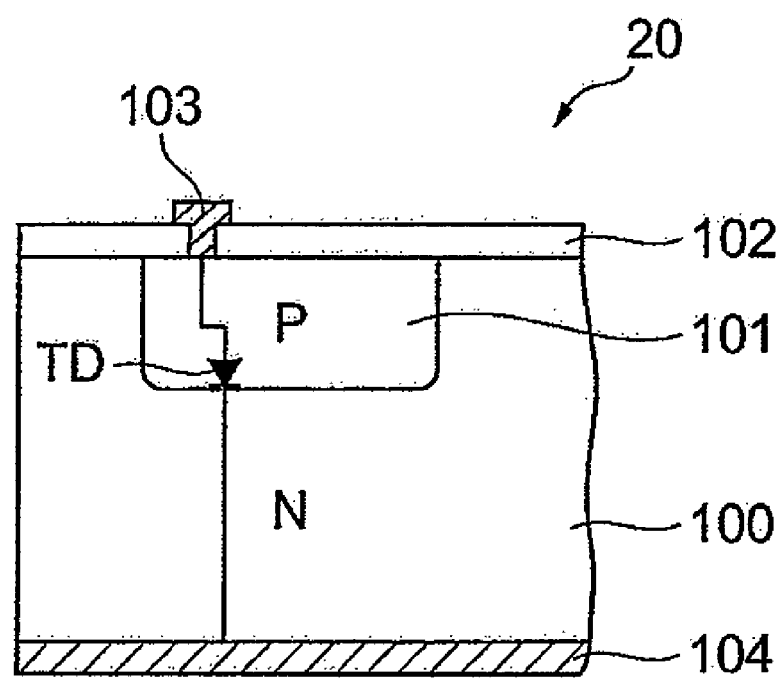
FIG. 8 is a sectional view taken along arrow VIII-VIII of a triggering photosensitive region 20 shown in FIG. 7.

It is preferable that the triggering photosensitive region 20 includes one triggering photodiode TD provided so as to surround the imaging region 10 as shown in the drawing (refer to FIG. 8).

Figure 7:
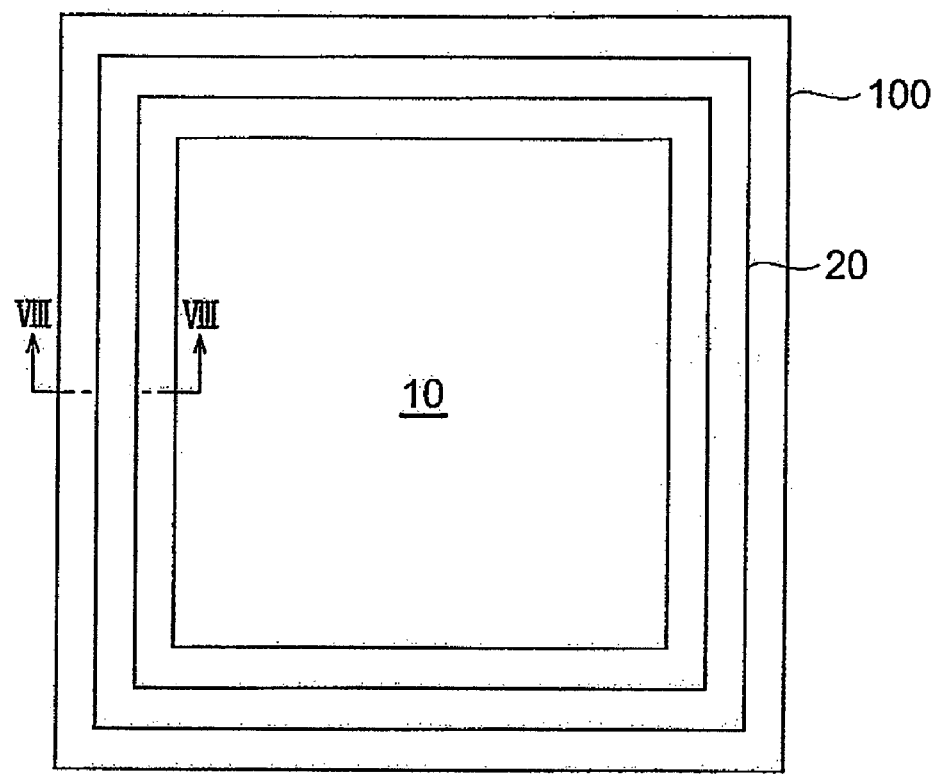
FIG. 7 is a schematic plan view of the solid-state image pickup device 1.

FIG. 7 is a schematic plan view of the solid-state image pickup apparatus 1, and the imaging region 10 is set in the center of a semiconductor substrate 100, and the triggering photosensitive region 20 is provided so as to surround the imaging region 10.

FIG. 8 is a sectional view taken along arrow VIII-VIII of the triggering photosensitive region 20 shown in FIG. 7. A P-type semiconductor region 101 is formed at the surface side of an N-type semiconductor substrate 100, and the surface of the semiconductor substrate 100 is covered with an insulating layer 102, and an upper electrode 103 contacts the P-type semiconductor region 101 via a contact hole provided in the insulating layer 102. A lower electrode 104 is provided on the back surface of the semiconductor substrate 100. A PN junction is formed on the interface between the P-type semiconductor region 101 and the N-type semiconductor substrate 100, and these constitute one triggering photodiode TD. That is, the P-type semiconductor region 101 continuously surrounds the circumference of the imaging region 10.

Figure 9:
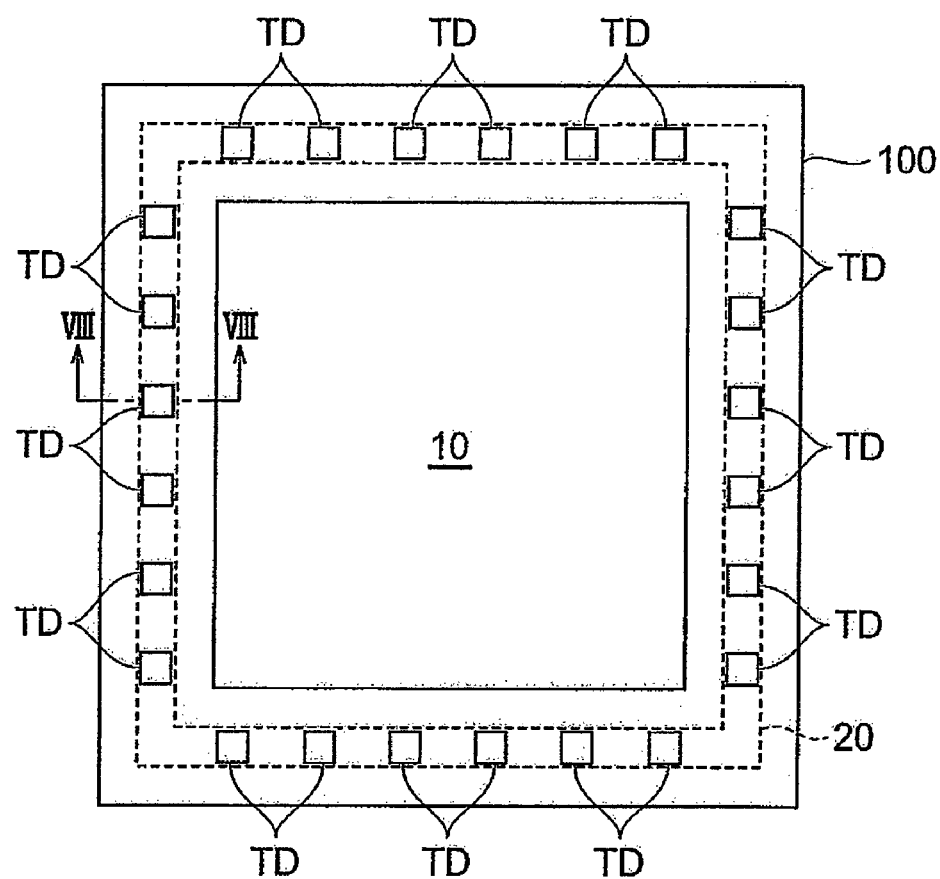
FIG. 9 is a schematic plan view of the solid-state image pickup device 1.

It is also preferable that the triggering photosensitive region 20 includes a plurality of triggering photodiodes TD provided around the imaging region 10 so as to be connected to one another in parallel (refer to FIG. 9).

FIG. 9 is a schematic plan view of the solid-state image pickup apparatus 1, and the imaging region 10 is set in the center of the semiconductor substrate 100, and the triggering photosensitive region 20 is provided so as to surround the imaging region 10. A sectional view taken along arrow VIII-VIII of the triggering photodiodes TD in the triggering photosensitive region 20 shown in FIG. 9 is the same as that shown in FIG. 8.

Figure 10:
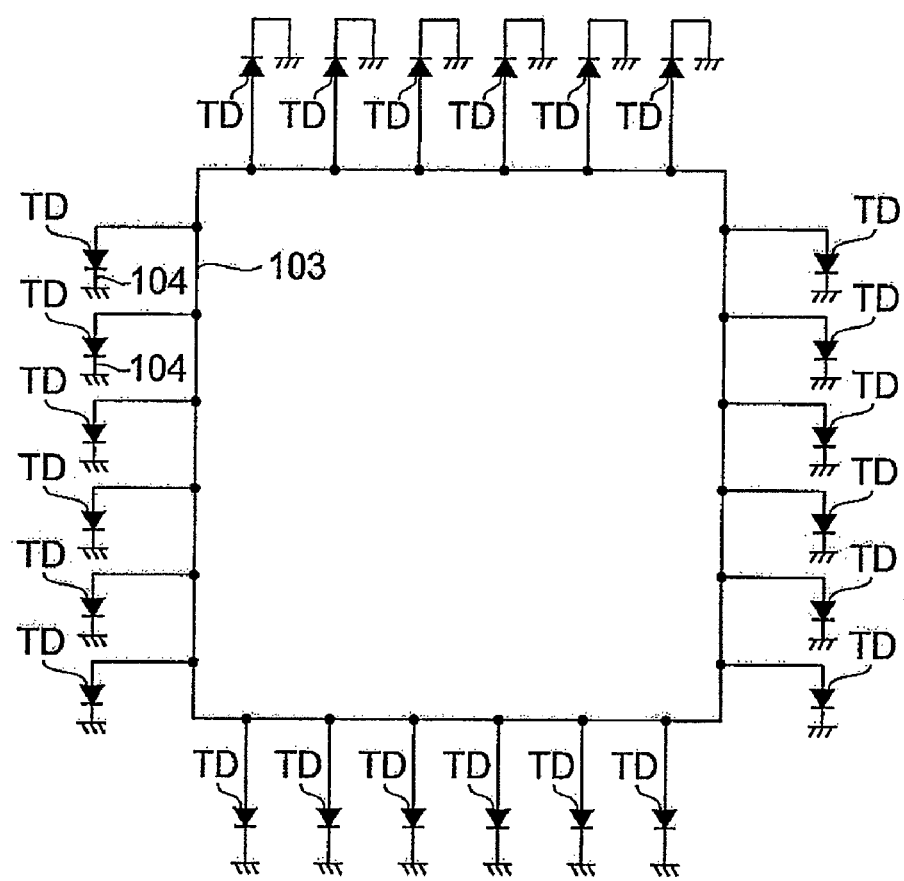
FIG. 10 is a circuit diagram showing an electrical connection relationship among triggering photodiodes TD in the triggering photosensitive region 20 shown in FIG. 9.

FIG. 10 is a circuit diagram showing an electrical connection relationship among the triggering photodiodes TD in the triggering photosensitive region 20 shown in FIG. 9. The anodes of the triggering photodiodes TD are connected with a common wiring formed of the upper electrode 103, and the cathodes thereof are grounded via a common electrode formed of the lower electrode 104.

Description of the present invention will be continued with reference to FIG. 1 again. The row selecting section 30 sequentially designates the respective rows in the imaging region 10 to output a voltage value according to an amount of electric charge stored in the charge storing section in each of the N pixels $P_{m,1}$ to $P_{m,N}$ in the designated m-th row to the voltage holding section 50 under control of the controlling section 70. The row selecting section 30 includes an M-staged shift register circuit, and is capable of sequentially designating each row in the imaging region 10 by an output bit at each stage of this shift register circuit.

The voltage holding section 50 includes N holding circuits $H_1$ to $H_N$ having a common configuration. The holding circuit $H_n$ is connected to the M pixels $P_{1,n}$ to $P_{M,n}$ in the n-th column in the imaging region 10, and a voltage value output from one pixel $P_{m,n}$ of the pixels is input thereto, and the voltage holding section 50 holds and outputs the input voltage value. The holding circuit $H_n$ is capable of not only holding a voltage value indicating a signal component superimposed with a noise component but also holding a voltage value indicating a noise component.

The column selecting section 40 sequentially designates the N holding circuits $H_1$ to $H_N$ included in the voltage holding section 50 to output a voltage value held by the designated n-th holding circuit $H_n$ to the output section 60. The column selecting section 40 includes an N-staged shift register circuit, and is capable of sequentially designating the N holding circuits $H_1$ to $H_N$ by an output bit at each stage of this shift register circuit.

The output section 60 outputs a digital value (pixel data) according to the amount of electric charge stored in the charge storing section in each of the M×N pixels $P_{1,1}$ to $P_{M,N}$ after a period instructed by the controlling signal of the charge storing operation, which is output from the controlling section 70 (i.e., a period in which electric charge generated in the photodiode in each pixel $P_{m,n}$ is stored in the charge storing section). Further, the output section 60 outputs a digital value (triggering data) according to the amount of electric charge generated in the triggering photosensitive region 20 during a period in which the pixel data is not output. The output section 60 operates with lower power consumption at the time of outputting the triggering data as compared with the time of outputting the pixel data.

It is preferable that the output section 60 outputs the pixel data and the triggering data to a common output signal line Lout, and it is also preferable that the output section 60 outputs these data as serial data. In these cases, the number of wirings for outputting these data can be reduced, which is advantageous from the standpoint of improvement in reliability.

The controlling section 70 is to control the operations of the solid-state image pickup device 1 as a whole. For example, the controlling section 70 controls a row selecting operation in the row selecting section 30, a column selecting operation in the column selecting section 40, a data holding operation in the voltage holding section 50, and output operations of pixel data and triggering data in the output section 60. Further, the triggering data output from the output section 60 is input to the controlling section 70, and the controlling section 70 outputs a controlling signal of a charge storing operation, which is instructing each of the pixels $P_{m,1}$ to $P_{m,N}$ in the imaging region 10 to perform a charge storing operation when an absolute value of the triggering data is greater than a threshold value. Moreover, the controlling section 70 outputs a clock signal CLK synchronized with the output timing of each bit of each of the pixel data and the triggering data by the output section 60.

In addition, a controlling signal of a charge storing operation, which is instructing each of the pixels $P_{m,1}$ to $P_{m,N}$ in the imaging region 10 to perform a charge storing operation may be supplied directly from the controlling section 70 to the imaging region 10, and may instruct it to perform a charge storing operation along with controlling signals (a Reset(m) signal, a Trans(m) signal, and a Hold(m) signal which will be described later) provided to a gate terminal of each transistor included in each pixel $P_{m,n}$. Or, a controlling signal of a charge storing operation may be supplied from the controlling section 70 to the row selecting section 30, and the controlling signals provided to a gate terminal of each transistor included in each pixel $P_{m,n}$ may be generated on the basis of the controlling signal of the charge storing operation.

Figure 2:
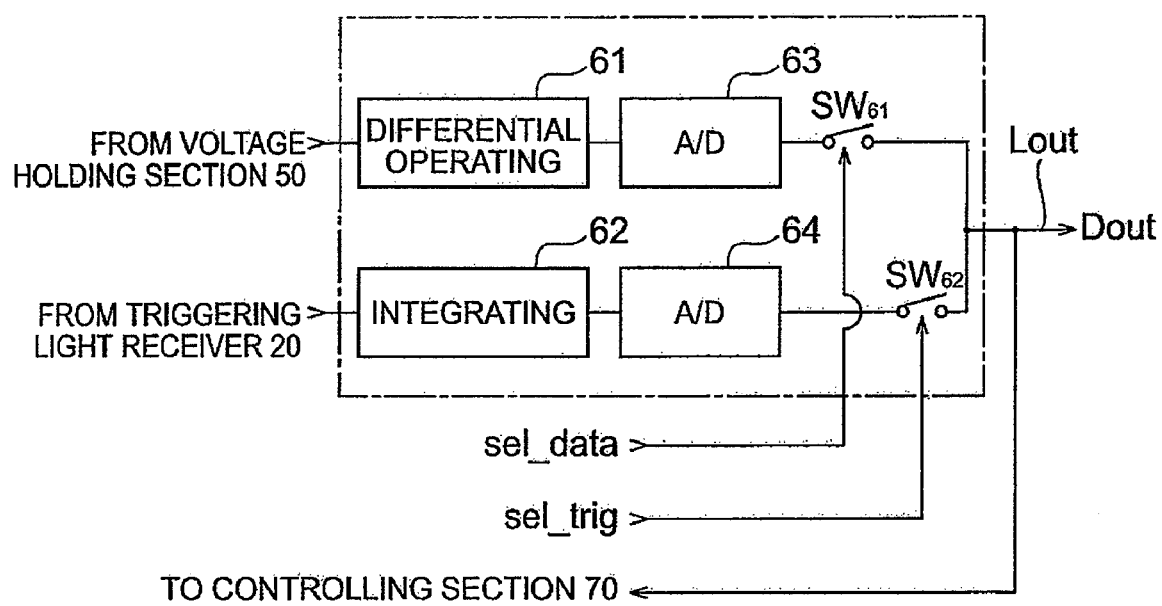
FIG. 2 is a configuration diagram of an output section 60 included in the solid-state image pickup device 1 according to the present embodiment.

FIG. 2 is a configuration diagram of the output section 60 included in the solid-state image pickup device 1 according to the present embodiment. The output section 60 shown in this drawing has a differential operating circuit 61, an integrating circuit 62, an imaging A/D converting circuit 63, a triggering A/D converting circuit 64, a switch $SW_{61}$, and a switch $SW_{62}$.

With respect to the differential operating circuit 61, a voltage value indicating a signal component superimposed with a noise component is input from the holding circuit $H_n$, and a voltage value indicating a noise component as well is input from the holding circuit $H_n$, and the differential operating circuit 61 outputs a voltage value according to a difference between the both values. The voltage value output from the differential operating circuit 61 indicates a signal component whose noise component has been removed. With respect to the integrating circuit 62, electric charge output from the triggering photosensitive region 20 is input to be stored, and the integrating circuit 62 outputs a voltage value according to an amount of the stored electric charge.

The voltage value output from the differential operating circuit 61 is input to the imaging A/D converting circuit 63, and the imaging A/D converting circuit 63 converts the input voltage value from analog to digital, and outputs a digital value (pixel data) which is a result of the A/D conversion. The voltage value output from the integrating circuit 62 is input to the triggering A/D converting circuit 64, and the triggering A/D converting circuit 64 converts the input voltage value from analog to digital, and outputs a digital value (triggering data) which is a result of the A/D conversion.

The imaging A/D converting circuit 63 performs an A/D-converting operation after the period instructed by the controlling signal of the charge storing operation to output: pixel data. During a period when the imaging A/D converting circuit 63 does not output the pixel data, the triggering A/D converting circuit 64 outputs triggering data. The triggering A/D converting circuit 64 operates at a lower speed or with a smaller number of output bits as compared with the imaging A/D converting circuit 63.

The switch $SW_{61}$ is controlled by a sel_data signal output from the controlling section 70 to perform an opening/closing operation. When the switch $SW_{61}$ is closed, the pixel data output from the imaging A/D converting circuit 63 is output to the output signal line Lout. The switch $SW_{62}$ is controlled by a sel_trig signal output from the controlling section 70 to perform an opening/closing operation. When the switch $SW_{62}$ is closed, the triggering data output from the triggering A/D converting circuit 64 is output to the output signal line Lout. The switch $SW_{61}$ and the switch $SW_{62}$ are not simultaneously closed in any case.

In addition, the output section 60 may include a common A/D converting circuit serving as the imaging A/D converting circuit 63 and the triggering A/D converting circuit 64. In that case, the A/D converting circuit operates at a lower speed or with a smaller number of output bits at the time of outputting the triggering data as compared with the time of outputting the pixel data. For example, when the A/D converting circuit is a pipeline system, a number of stages to be operated is made less at the time of outputting the triggering data as compared with the time of outputting the pixel data. Further, for example, when the A/D converting circuit is a successive approximation system using a plurality of capacitors, a number of capacitors to be used is made less at the time of outputting the triggering data as compared with the time of outputting the pixel data.

Figure 3:
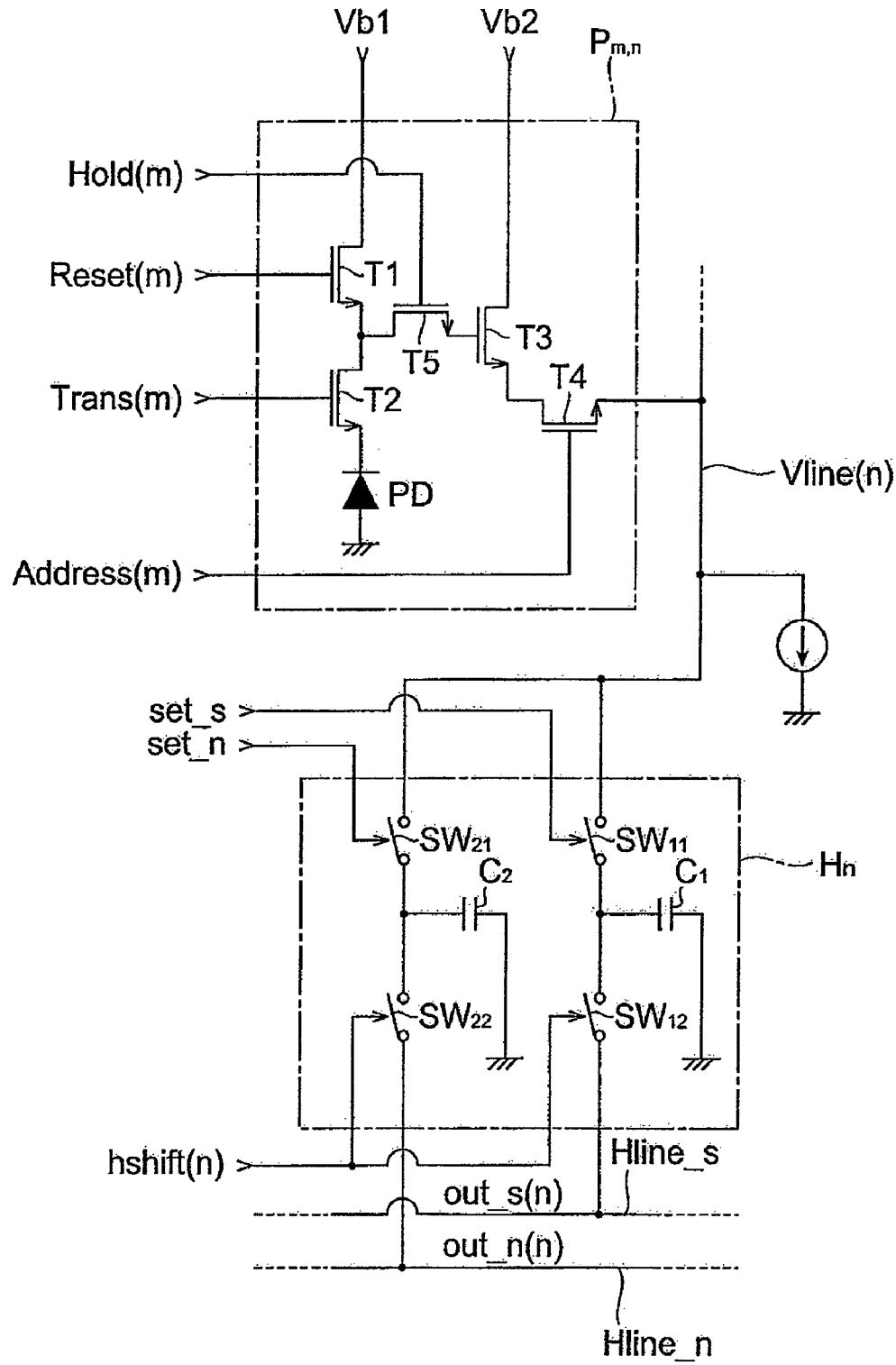
FIG. 3 is a diagram showing the respective circuit configurations of a pixel $P_{m,n}$ and a holding circuit $H_n$ included in the solid-state image pickup device 1 according to the present embodiment.

FIG. 3 is a diagram showing the circuit configurations of a pixel $P_{m,n}$ and a holding circuit $H_n$ included in the solid-state image pickup device 1 according to the present embodiment. In this drawing, the pixel $P_{m,n}$ is shown as a representative of the M×N pixel $P_{1,1}$ to $P_{M,N}$ and the holding circuit $H_n$ is shown as a representative of the N holding circuits $H_1$ to $H_N$.

The pixel $P_{m,n}$ is of an APS (Active Pixel Sensor) type, and includes a photodiode PD and five transistors T1 to T5. As shown in this drawing, the transistor T1, the transistor T2, and the photodiode PD are connected in series in this order, and a reference voltage Vb1 is input to a drain terminal of the transistor T1, and an anode terminal of the photodiode PD is grounded.

The transistor T3 and the transistor T4 are connected in series, and a reference voltage Vb2 is input to a drain terminal of the transistor T3, and a source terminal of the transistor T4 is connected to a wiring Vline(n). A junction point between the transistor T1 and the transistor T2 is connected to a gate terminal of the transistor T3 via the transistor T5. Further, a constant current source is connected to the wiring Vline(n).

A Reset(m) signal is input to a gate terminal of the transistor T1, a Trans(m) signal is input to a gate terminal of the transistor T2, an Address(m) signal is input to a gate terminal of the transistor T4, and a Hold(m) signal is input to a gate terminal of the transistor T5. These Reset(m) signal, Trans(m) signal, Address(m) signal, and Hold(m) signal are output from the row selecting section 30 under the control of the controlling section 70 to be input in common to the N pixel $P_{m,1}$ to $P_{m,N}$ in the m-th row.

When the Reset(m) signal and the Trans(m) signal are at a high level, electric charge is discharged from a junction capacitance section (the charge storing section: the factor is the same as that of the photodiode PD) of the photodiode PD. When the Hold(m) signal is also at a high level, the electric potential of the gate terminal of the transistor T3 is reset. Thereafter, when the Reset(m) signal, the Trans(m) signal, and the Hold(m) signal cone to a low level, the electric charge generated in the photodiode is stored in the junction capacitance section. When the Hold(m) signal is at a low level and the Address(m) signal is at a high level, a noise component is output from the pixel $P_{m,n}$ to the wiring Vline(n). Then, when the Trans(m) signal, the Hold(m) signal, and the Address(m) signal come to a high level, a voltage value according to the amount of the electric charge stored in the junction capacitance section of the photodiode PD is output as a signal component to the wiring Vline(n).

The holding circuit $H_n$ includes two capacitors $C_1$ and $C_2$ and four switches $SW_{11}$, $SW_{12}$, $SW_{21}$, and $SW_{22}$. In this holding circuit $H_n$, the switch $SW_{11}$ and the switch $SW_{12}$ are connected in series so as to be provided between the wiring Vline(n) and a wiring Hline_s, and one end of the capacitor $C_1$ is connected to a junction point between the switch $SW_{11}$ and the switch $SW_{12}$, and the other end of the capacitor $C_1$ is grounded. Further, the switch $SW_{21}$ and the switch $SW_{22}$ are connected in series so as to be provided between the wiring Vline(n) and a wiring Hline_n, and one end of the capacitor $C_2$ is connected to a junction point between the switch $SW_{21}$ and the switch $SW_{22}$, and the other end of the capacitor $C_2$ is grounded.

In this holding circuit $H_n$, the switch $SW_{11}$, is opened and closed according to a level of a set_s signal supplied from the controlling section 70. The switch $SW_{21}$ is opened and closed according to a level of a set_n signal supplied from the controlling section 70. The set_s signal and the set_n signal are input in common to the N holding circuits $H_1$ to $H_N$. The switches $SW_{12}$ and $SW_{22}$ are opened and closed according to a level of an hshift(n) signal supplied from the controlling section 70.

In this holding circuit $H_n$, a noise component that is being output from the pixel $P_{m,n}$ to the wiring Vline(n) when the set_n signal is switched from a high level to a low level to open the switch $SW_{21}$ is held as a voltage value out_n(n) by the capacitor $C_2$. A signal component that is being output from the pixel $P_{m,n}$ to the wiring Vline(n) when the set_s signal is switched from a high level to a low level to open the switch $SW_{11}$ is held as a voltage value out_s(n) by the capacitor $C_1$. Then, when the hshift(n) signal comes to a high level, the switch $SW_2$ is closed, and the voltage value out_s(n) that has been held by the capacitor $C_1$ is output to the wiring Hline_s, and further, the switch $SW_{22}$ is closed, and the voltage value out_n(n) that has been held by the capacitor $C_2$ is output to the wiring Hline_n. A difference between these voltage values out_s(n) and out_n(n) indicates a voltage value according to the amount of electric charge generated by the photodiode PD in the pixel $P_{m,n}$.

Figure 4:
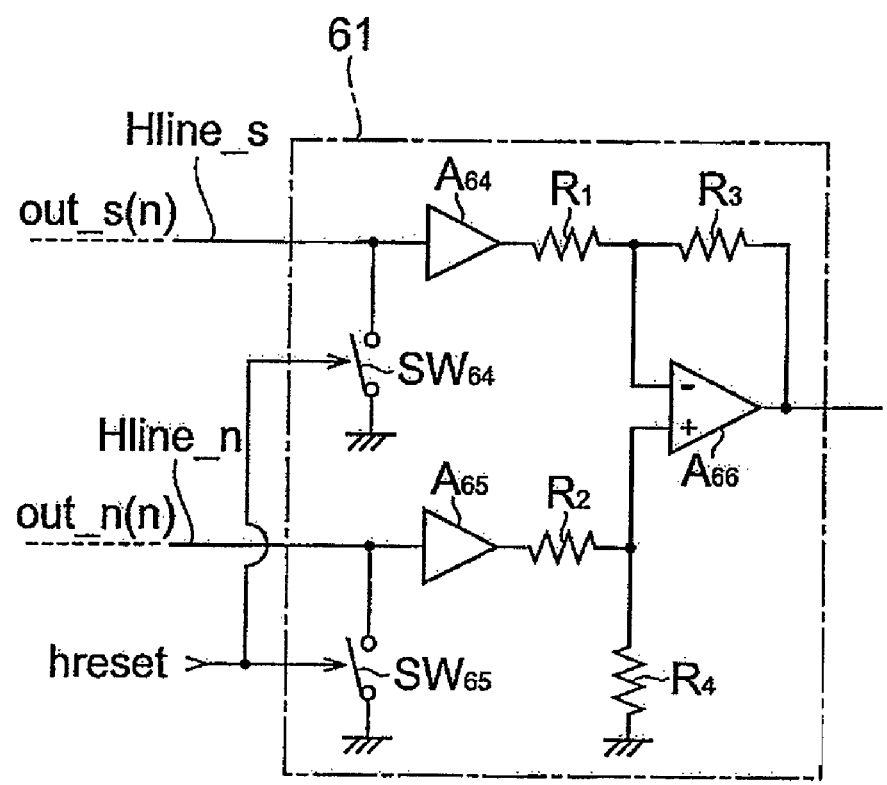
FIG. 4 is a diagram showing the circuit configuration of a differential operating circuit 61 included in the solid-state image pickup device 1 according to the present embodiment.

FIG. 4 is a diagram showing the circuit configuration of the differential operating circuit 61 included in the solid-state image pickup device 1 according to the present embodiment. As shown in this drawing, the differential operating circuit 61 includes amplifiers $A_{64}$ to $A_{66}$, switches $SW_{64}$ and $SW_{65}$, and resistors $R_1$ to $R_4$. An inverting input terminal of the amplifier $A_{66}$ is connected to an output terminal of the buffer amplifier $A_{64}$ via the resistor $R_1$, and is connected to its own output terminal via the resistor $R_3$. A non-inverting input terminal of the amplifier $A_{66}$ is connected to an output terminal of the buffer amplifier $A_{65}$ via the resistor $R_2$, and is connected to the ground potential via the resistor $R_4$. An output terminal of the amplifier $A_{66}$ is connected to an input terminal of the imaging A/D converting circuit 63. An input terminal of the buffer amplifier A is connected to the N holding circuits $H_1$ to $H_N$ via the wiring Hline_s, and is connected to the ground potential via the switch $SW_{64}$. An input terminal of the buffer amplifier $A_{65}$ is connected to the N holding circuits $H_1$ to $H_N$ via the wiring Hline_n, and is connected to the ground potential via the switch $SW_{65}$.

The switches $SW_{64}$ and $SW_{65}$ of the differential operating circuit 61 are controlled by an hreset signal to perform opening/closing operations. When the switch $SW_{64}$ is closed, the voltage value to be input to the input terminal of the buffer amplifier $A_{64}$ is reset. When the switch $SW_{65}$ is closed, the voltage value to be input to the input terminal of the buffer amplifier $A_{65}$ is reset. When the switches $SW_{64}$ and $SW_{65}$ are open, voltage values out_s(n) and out_n(n) output to the wirings Hline_s and Hline_n from one holding circuit $H_n$ among the N holding circuits $H_1$ to $H_N$ are input to the input terminals of the buffer amplifiers $A_{64}$ and $A_{65}$. Assuming that the buffer amplifiers $A_{64}$ and $A_{65}$ respectively have an amplification factor of 1 and the respective resistance values of the four resistors $R_1$ to $R_4$ are equal to one another, a voltage value output from an output terminal of the differential operating circuit 61 indicates a difference between the voltage values input respectively through the wiring Hline_s and the wiring Hline_n.

Figure 5:
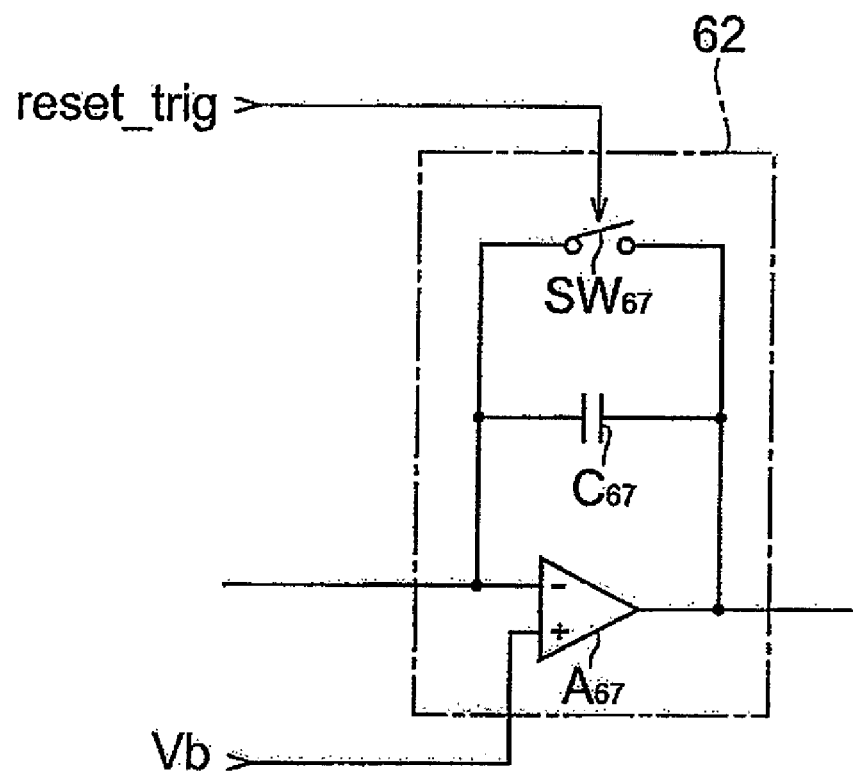
FIG. 5 is a diagram showing the circuit configuration of an integrating circuit 62 included in the solid-state image pickup device 1 according to the present embodiment.

FIG. 5 is a diagram showing the circuit configuration of the integrating circuit 62 included in the solid-state image pickup device 1 according to the present embodiment. As shown in this drawing, the integrating circuit 62 includes an amplifier $A_{67}$, a capacitor $C_{67}$, and a switch $SW_{67}$. The capacitor $C_{67}$ and the switch $SW_{67}$ are connected in parallel to one another so as to be provided between an inverting input terminal and an output terminal of the amplifier $A_{67}$. The inverting input terminal of the amplifier $A_{67}$ is connected to the triggering photosensitive region 20. A non-inverting input terminal of the amplifier $A_{67}$ is connected to a reference potential Vb. The output terminal of the amplifier $A_{67}$ is connected to an input terminal of the triggering A/D converting circuit 64. The switch $SW_{67}$ of the integrating circuit 62 is controlled by a reset_trig signal to perform an opening/closing operation. When the switch $SW_{67}$ is closed, electric charge is discharged from the capacitor $C_{67}$, and a voltage value output from the integrating circuit 62 is reset. When the switch $SW_{67}$ is open, the electric charge output from the triggering photosensitive region 20 is stored in the capacitor $C_{67}$, and a voltage value according to the amount of stored electric charge is output from the integrating circuit 62.

Figure 6:
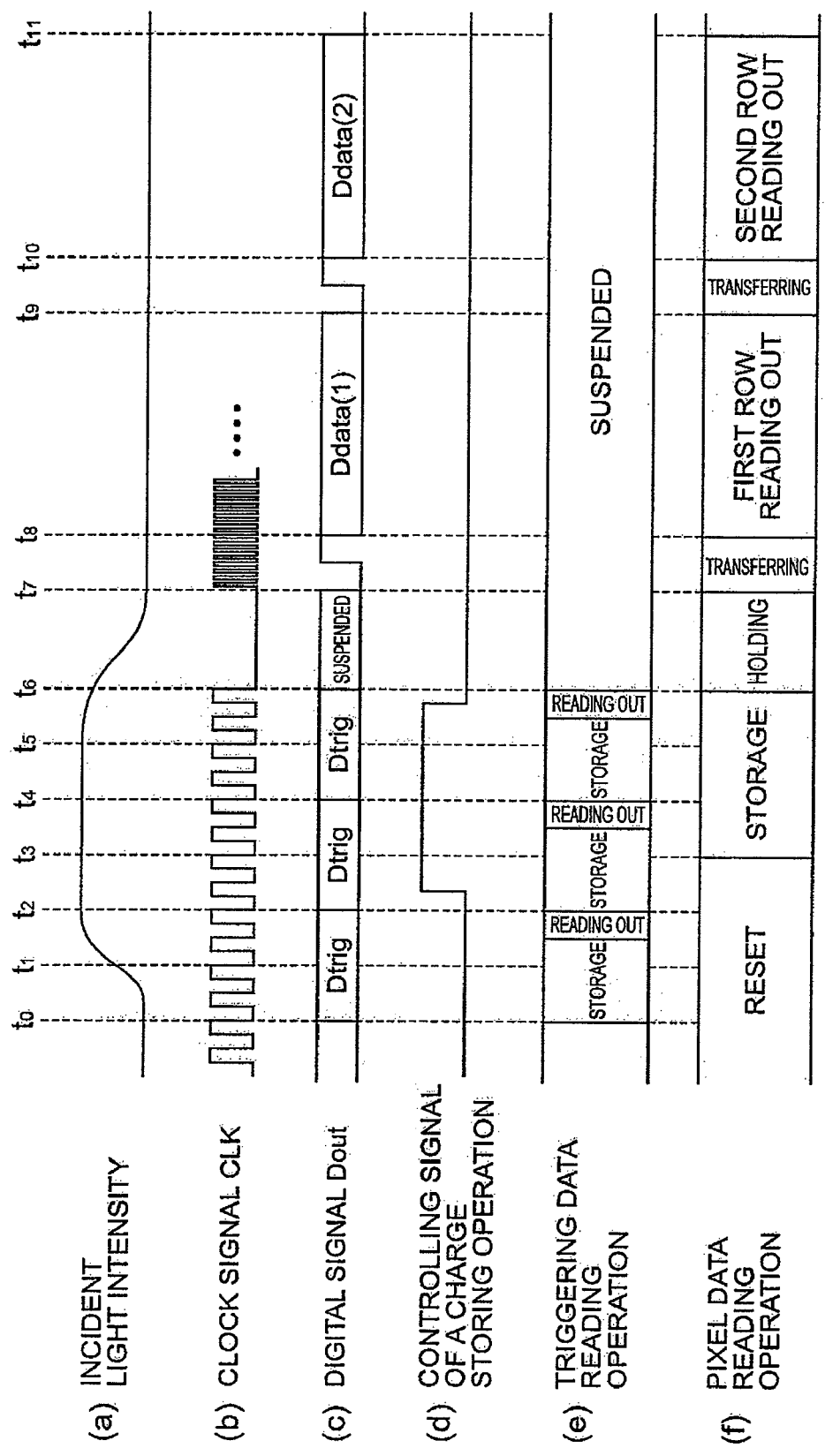
FIG. 6 is a timing chart showing an example of operations of the solid-state image pickup device 1 according to the present embodiment.

Next, description will be given of an example of operations of the solid-state image pickup device 1 according to the present embodiment. FIG. 6 is a timing chart showing an example of operations of the solid-state image pickup device 1 according to the present embodiment. The solid-state image pickup device 1 operates under the control of the controlling section 70. In this drawing, there are shown (a) Light intensity to be incident into the solid-state image pickup device 1, (b) Clock signal CLK output from the controlling section 70, (c) Digital signal Dout (pixel data Ddata(m) or triggering data Dtrig) output from the output section 60 to the output signal line Lout, (d) Controlling signal of the charge storing operation output from the controlling section 70, (e) Triggering data reading operation by the triggering photosensitive region 20, the integrating circuit 62, and the triggering A/D converting circuit 64, and (f) Pixel data reading operation by the imaging region 10, the voltage holding section 50, the differential operating circuit 61, and the imaging A/D converting circuit 63 in this order.

In this drawing, with respect to the m-th row in the imaging region 10, a digital value (pixel data) output from the imaging A/D converting circuit 63 is expressed as Ddata(m), and a digital value (triggering data) output from the triggering A/D converting circuit 64 is expressed as Dtrig. Clock times $t_0$, $t_1$, $t_2$, $t_3$, $t_5$, and $t_6$ indicate trailing edge clock times of the clock signal CLK output from the controlling section 70. Further, before the clock time $t_0$ and after the clock time $t_7$, a light is not incident into the solid-state image pickup device 1, and a light is incident into the solid-state image pickup device 1 during the period from the clock time $t_0$ to the clock time $t_7$.

During a given period immediately after a power supply is applied to the solid-state image pickup device 1, the controlling signal of the charge storing operation, which is output from the controlling section 70 is set to be a high level. Then, after the controlling signal of the charge storing operation is shifted to a low level, pixel data of one frame are output from the output section 60 through the imaging region 10, the voltage holding section 50, the differential operating circuit 61, the imaging A/D converting circuit 63, and the switch $SW_{61}$. The pixel data output at this time is insignificant. However, because the controlling signal of the charge storing operation is set to be a high level during the given period after application of power, each pixel $P_{m,n}$ in the imaging region 10 and the other circuits are reset, which allows normal performance thereafter.

Thereafter, before the clock time $t_0$, the triggering data Dtrig according to the amount of light received at the triggering photosensitive region 20 is output from the output section 60 through the integrating circuit 62, the triggering A/D converting circuit 64, and the switch $SW_{61}$. The clock signal CLK output from the controlling section 70 is to be synchronized with the output timing of each bit of the triggering data. Then, in the controlling section 70, it is judged that an absolute value of the triggering data Dtrig is less than the threshold value, and that a light is not incident into the solid-state image pickup device 1 (or the incident light amount is less than a certain level), and the controlling signal of the charge storing operation is kept to be a low level.

Further, before the clock time $t_0$, the respective pixels $P_{1,1}$ to $P_{M,N}$ in the imaging region 10 are kept in a reset state. That is, the Reset(m) signal, the Trans(m) signal, and the Hold (m) signal supplied from the row selecting section 30 to each pixel $P_{m,n}$ are all set to be a high level, and the transistors $T_1$, $T_2$, and $T_5$ are in an on-state, and electric charge is discharged from the junction capacitance section (the charge storing section) of the photodiode PD, and the electric potential of the gate terminal of the transistor T3 is reset. Further, the imaging A/D converting circuit 63 is in a suspended state, and the switch $SW_{61}$ is open.

When light begins to be incident into the solid-state image pickup device 1 after the clock time $t_0$, it is judged in the controlling section 70 that an absolute value of the triggering data Dtrig output from the output section 60 is greater than the threshold value, and that the light is incident into the solid-state image pickup device 1 (or an incident light amount is greater than a certain level), and the controlling signal of the charge storing operation is shifted to a high level.

Then, during the period from the trailing edge clock time $t_3$ of the clock signal CLK after the controlling signal of the charge storing operation is shifted to a high level up to the trailing edge clock time $t_6$ of the clock signal CLK after the controlling signal of the charge storing operation is shifted to a low level, in each pixel $P_{m,n}$ in the imaging region 10, the Reset(m) signal, the Trans(m) signal, and the Hold (m) signal shift to a low level, and the transistors $T_1$, $T_2$, and $T_5$ come into an off-state, and the electric charge generated in the photodiode is stored in the junction capacitance section.

During this period from the clock time $t_3$ to the clock time $t_6$, triggering data Dtrig according to an amount of the light received at the triggering photosensitive region 20 is output from the output section 60 through the integrating circuit 62, the triggering A/D converting circuit 64, and the switch $SW_{61}$. The clock signal CLK output from the controlling section 70 is to be synchronized with the output timing of each bit of the triggering data. Further, the imaging A/D converting circuit 63 is in a suspended state, and the switch $SW_{61}$ is open.

In addition, a cumulative incident light amount can be monitored on the basis of the triggering data output at this time. Then, a time for charge storage (i.e., a period when the controlling signal of the charge storing operation is at a high level) in the imaging region 10 can be set to an appropriate value on the basis of the monitored cumulative incident light amount. Further, the controlling signal of the charge storing operation may be shifted to a low level at a point in time when the monitored incident light amount is made less than a certain level. Or, in a case in which an incident light amount can be predicted in advance, the controlling signal of the charge storing operation may be set to an appropriate value on the basis of the predicted value.

During the period from the clock time $t_6$ up to the clock time $t_7$ of the clock signal CLK after the controlling signal of the charge storing operation is shifted to a low level, in each pixel $P_{m,n}$ in the imaging region 10, the Reset(m) signal and the Address(m) signal shift to a low level, and the transistors $T_1$ and $T_4$ come into an off-state, and the Trans(m) signal and the Hold(m) signal shift to a high level, and the transistors $T_2$ and $T_5$ come into an on-state. In accordance therewith, the electric charge stored in the junction capacitance section until that time move through the transistors $T_2$ and $T_5$ to the gate terminal of the transistor $T_3$ to be, held. However, because the transistor $T_4$ is in an off-state, a voltage value according to the amount of the stored electric charge is not output from each pixel $P_{m,n}$ to the wiring Vline(n) in any case.

During this period from the clock time $t_6$ up to the clock time $t_7$, both of the imaging A/D converting circuit 63 and the triggering A/D converting circuit 64 are in a suspended state, and no pixel data and triggering data is output: from the output section 60. Further, the clock signal CLK is not output from the controlling section 70.

During the following period from the clock time $t_7$ to the clock time $t_9$, N pixel data Ddata(1) according to the amounts of the stored electric charge in the N pixels $P_{1,1}$ to $P_{1,N}$ in the first row in the imaging region 10 are output from the output section 60. In detail, during the period from the clock time $t_7$ to the clock time $t_8$, the Address(1) signal comes to a low level only in the first row in the imaging region 10, and the transistor $T_4$ comes into an on-state, and a voltage value according to the amount of stored electric charge in each pixel $P_{1,n}$ in the first row is output to the wiring Vline(n) to be held by the holding circuit $H_n$ of the voltage holding section 50. Then, voltage values sequentially output from the respective holding circuits $H_n$ during the period from the clock time $t_8$ to the clock time $t_9$ are input into the imaging A/D converting circuit 63 via the differential operating circuit 61 to be converted from analog to digital, and N pixel data Ddata(1) are sequentially output from the imaging A/D converting circuit 63 via the switch $SW_{61}$. During this period from the clock time $t_7$ to the clock time $t_9$, the clock signal CLK output from the controlling section 70 is to be synchronized with the output timing of each bit of the imaging data. Further, the triggering A/D converting circuit 64 is in a suspended state, and the switch $SW_{62}$ is open.

During the following period from the clock time $t_9$ to the clock time $t_{11}$, N pixel data Ddata(2) according to the amounts of the stored electric charge in the N pixels $P_{2,1}$ to $P_{2,N}$ in the second row in the imaging region 10 are output from the output section 60. In detail, during the period from the clock time $t_9$ to the clock time $t_{10}$, the Address(2) signal comes to a low level only in the second row in the imaging region 10, and the transistor $T_4$ comes into an on-state, and a voltage value according to the amount of stored electric charge in each pixel $P_{2,n}$ in the second row is output to the wiring Vline(n) to be held by the holding circuit $H_n$ of the voltage holding section 50. Then, voltage values sequentially output from the respective holding circuits $H_n$ during the period from the clock time $t_{10}$ up to the clock time $t_{11}$ are input into the imaging A/D converting circuit 63 via the differential operating circuit 61 to be converted from analog to digital, and N pixel data Ddata(2) are sequentially output from the imaging A/D converting circuit 63 via the switch $SW_{61}$. During this period from the clock time $t_9$ to the clock time $t_{11}$, the clock signal CLK output from the controlling section 70 is to be synchronized with the output timing of each bit of the imaging data. Further, the triggering A/D converting circuit 64 is in a suspended state, and the switch $SW_{62}$ is open.

In the same way thereafter, N pixel data Ddata(m) according to the amounts of the stored electric charge in the N pixels $P_{m,1}$ to $P_{m,N}$ in the m-th row are output from the output section 60 sequentially from the third row to the M-th row in the imaging region 10. In this way, the pixel data Ddata(1) to Ddata(M) of one frame are output from the output section 60 through the imaging region 10, the voltage holding section 50, the differential operating circuit 61, the imaging A/D converting circuit 63, and the switch $SW_{61}$. Then, after the pixel data of one frame are output, the device returns to a state which is the same as that before the clock time $t_0$.

In this way, in the solid-state image pickup device 1 according to the present invention, the imaging A/D converting circuit 63 and the triggering A/D converting circuit 64 are provided, and the two A/D converting circuits 63 and 64 do not simultaneously operate in any case. During the period when it is monitored whether or not a light is incident into the solid-state image pickup device 1, and during the period when the electric charge generated in the photodiode in each pixel $P_{m,n}$ in the imaging region 10 is stored in the junction capacitance section after sensing the light incidence, the imaging A/D converting circuit 63 is suspended, and the triggering A/D converting circuit 64 operates. During the period when pixel data is read out after storing the electric charge in each pixel $P_{m,n}$ in the imaging region 10, the triggering A/D converting circuit 64 is suspended, and the imaging A/D converting circuit 63 operates.

Because the imaging A/D converting circuit 63 for reading out pixel data is required to operate at a high speed, and required to have a given number or more of output bits, the electric power consumption thereof is high. The clock signal CLK output from the controlling section 70 when the imaging A/D converting circuit 63 operates is to be a high-frequency signal in synchronization with the output timing of each bit in the pixel data. For example, in this case, the frequency of the clock signal is 80 MHz, the pixel data is 14-bit data, and the electric power consumption is 500 mW.

In contrast thereto, because the triggering A/D converting circuit 64 for reading out triggering data may operate at a low speed, and flier may have a small number of output bits, the electric power consumption thereof is low. The clock signal CLK output from the controlling section 70 when the triggering A/D converting circuit 64 operates is a low-frequency signal in synchronization with the output timing of each bit in the triggering data. For example, in this case, the frequency of the clock signal is 1 MHz, the triggering data is 8-bit data, and the electric power consumption is 25 mW.

The solid-state image pickup device 1 according to the present embodiment can achieve the advantageous effects in the following application, for example. that is, provided that scintillators are provided on the respective acceptance surfaces of the imaging region 10 and the triggering photosensitive region 20, the solid-state image pickup device 1 is capable of converting an incident X-ray beam into a visible light to receive the visible light with the photodiodes in the imaging region 10 or the triggering photosensitive region 20, and imaging the incident X-ray beam thereby. The solid-state image pickup device 1 in which such scintillators are provided is used for X-ray imaging in an oral cavity.

When the solid-state image pickup device 1 is used for X-ray imaging in an oral cavity, a period when an X-ray beam to be imaged is incident is extremely short, and the solid-state image pickup device 1 is required to capture the timing of X-ray incidence to image the X-ray beam. Then, the solid-state image pickup device 1 reads out triggering data by the triggering photosensitive region 20, the integrating circuit 62, and the triggering A/D converting circuit 64 before X-ray incidence, and senses the X-ray incidence on the basis of the triggering data. Then, after the solid-state image pickup device 1 senses the X-ray incidence, the solid-state image pickup device 1 reads out pixel data by the imaging region 10, the voltage holding section 50, the differential operating circuit 61, and the imaging A/D converting circuit 63. In this way, the solid-state image pickup device 1 is capable of capturing the timing of X-ray incidence to image the X-ray beam.

In this way, in a case m which the solid-state image pickup device 1 is used for X-ray imaging in an oral cavity, the triggering A/D converting circuit 64 can be suspended before X-ray incidence, and the triggering A/D converting circuit 64 may be operated only at the time of X-ray incidence. Accordingly, the solid-state image pickup device 1 is capable of suppressing increase in electric power consumption even if an attempt is made to increase the number of pixels or speed up imaging.

Further, in a case in which the solid-state image pickup device 1 is used for X-ray imaging in an oral cavity, it is preferable that pixel data and triggering data are output to the common output signal line Lout, and further, these data are output as serial data. In these cases, it is possible to reduce the number of wirings for outputting these data, which results in improvement in reliability.

Further, the solid-state image pickup device 1 is capable of storing electric charge generated in the photodiode during, the same period in each of the M×N pixels $P_{1,1}$ to $P_{M,N}$ in the imaging region 10 by the charge storing section after sensing light incidence, and after the charge storage, pixel data on each pixel $P_{m,n}$ can be sequentially output from the output section 60. Accordingly, even when a temporal change in an incident light amount is rapid, it is possible to obtain the incident light amounts of all the pixels during the same period, which makes it possible to perform highly precise imaging.

The present invention is not limited to the above-described embodiment, and various modifications are possible. For example, in the above-described embodiment, the controlling section 70 generates a controlling signal of a charge storing operation. However, an external device that generates a controlling signal of a charge storing operation on the basis of triggering data may be provided separately from the solid-state image pickup device. In this case, triggering data is output to the external device from the output section of the solid-state image pickup device, and a controlling signal of a charge storing operation is generated by the external device on the basis of the output triggering data, and the generated controlling signal of the charge storing operation is provided to the solid-state image pickup device from the external device.

In this way, at the time of sensing light incidence based on a comparison of values between the triggering data and a threshold value, the threshold value can be flexibly adjusted by the external device. Further, a period when the controlling signal of the charge storing operation makes an instruction to store electric charge (i.e., a period when electric charge generated in the photodiode in each pixel is stored by the charge storing section) can be flexibly adjusted by the external device, which makes it possible to easily respond to a wide range of incident light amounts.

The above-described solid-state image pickup device includes the triggering photosensitive region 20, the imaging region 10 having a plurality of pixels, in which electric charge generated in the pixel P(m,n) during a first period ($t_3$ to $t_6$) is stored, and the output section 60 that outputs triggering data (trig) which is a digital value from the triggering photosensitive region 20, and outputs pixel data (Ddata) which is a digital value from the imaging region 10 during a second period ($t_8$ to $t_9$) different from the first period ($t_3$ to $t_6$), and operates with lower power consumption at the time of outputting the triggering data (Dtrig) as compared with the time of outputting the pixel data (Ddata). Accordingly, the power consumption of the entire device can be reduced.

Further, the output section 60 outputs the triggering data (Dtrig) from the triggering photosensitive region 20 during a period overlapping with the first period ($t_3$ to $t_6$). In this example, because the triggering data is output during a period overlapping with the first period when storage is achieved, an entire period from charge storage to data output can be shortened.

The invention claimed is:

1. A solid-state image pickup device comprising:
   an imaging region which includes a plurality of pixels each having a photodiode that generates electric charge of an amount according to an incident light amount and a charge storing section storing the electric charge, the imaging region storing electric charge generated in the photodiode in each of the plurality of pixels by the charge storing section during a period instructed by a controlling signal of a charge storing operation;
   a triggering photosensitive region which includes a triggering photodiode that generates electric charge of an amount according to an incident light amount; and
   an output section including:
     an imaging A/D converting circuit that outputs pixel data which is a digital value according to the amount of electric charge stored in the charge storing section in each of the plurality of pixels after the period instructed by the controlling signal of the charge storing operation, and
     a triggering A/D converting circuit that outputs triggering data which is a digital value according to the amount of electric charge generated in the triggering photosensitive region during a period when the pixel data is not output by the imaging A/D converting circuit; and a controlling section to which the triggering data output from the output section is input, the controlling section generating the controlling signal of the charge storing operation, which instructs each of the plurality of pixels in the imaging region to perform a charge storing operation when an absolute value of the triggering data is greater than a threshold value, the controlling section outputting a clock signal synchronized with the output timing of each bit of each of the pixel data and the triggering data by the output section, wherein the triggering A/D converting circuit operates with lower power consumption than a lower power consumption by the imaging A/D converting circuit outputting the pixel data, and the triggering A/D converting circuit also operates with lower speed than a speed of the imaging A/D converting circuit outputting the pixel data.

2. The solid-state image pickup device according to claim 1, wherein
the triggering A/D converting circuit operates with a smaller number of output bits at the time of outputting the triggering data than a number of output bits by the imaging A/D converting circuit outputting the pixel data.

3. The solid-state image pickup device according to claim 1, wherein
the output section outputs the pixel data and the triggering data to a common output signal line.

4. The solid-state image pickup device according to claim 1, wherein
the triggering photosensitive region includes one triggering photodiode provided so as to surround the imaging region.

5. The solid-state image pickup device according to claim 1, wherein
the triggering photosensitive region includes a plurality of triggering photodiodes which are provided around the imaging region so as to be connected to one another.

6. A solid-state image pickup device comprising:
a triggering photosensitive region;
an imaging region which includes a plurality of pixels, the imaging region storing electric charge generated in the pixels during a first period; and
an output section including:
    a triggering A/D converting circuit that outputs triggering data which is a digital value from the triggering photosensitive region, and
    an imaging A/D converting circuit that outputs pixel data which is a digital value from the imaging region during a second period different from the first period,
    the controlling section outputting a clock signal synchronized with output timing of each bit of each of the pixel data and the triggering data by the output section,
    the triggering A/D converting circuit operating with lower power consumption at the time of outputting the triggering data than a power consumption of the imaging A/D converting circuit outputting the pixel data,
    the triggering A/D converting circuit also operating with lower speed than a speed of the imaging A/D converting circuit outputting the pixel data.

7. The solid-state image pickup device according to claim 6, wherein
the output section outputs the triggering data from the triggering photosensitive region during a period overlapping with the first period.

* * * * *